(12) United States Patent
Huang et al.

(10) Patent No.: US 9,392,712 B2
(45) Date of Patent: Jul. 12, 2016

(54) ELECTRICAL MODULE AND DEVICE USING THE SAME

(71) Applicant: ABILITY ENTERPRISE CO., LTD., New Taipei (TW)

(72) Inventors: Yu-Cheng Huang, New Taipei (TW); Yi-Tong Wang, New Taipei (TW); Chen-Kang Ma, New Taipei (TW)

(73) Assignee: ABILITY ENTERPRISE CO., LTD., New Taipei (TW)

( * ) Notice: Subject to any disclaimer, the term of this patent is extended or adjusted under 35 U.S.C. 154(b) by 69 days.

(21) Appl. No.: 14/288,888

(22) Filed: May 28, 2014

(65) Prior Publication Data
US 2014/0355223 A1  Dec. 4, 2014

(30) Foreign Application Priority Data
May 30, 2013 (CN) .................. 2013 2 0304878 U

(51) Int. Cl.
*H05K 1/14* (2006.01)
*H05K 5/06* (2006.01)
*H02J 7/00* (2006.01)

(52) U.S. Cl.
CPC ............... *H05K 5/061* (2013.01); *H02J 7/0042* (2013.01)

(58) Field of Classification Search
USPC .............. 361/728–732, 752, 796, 800, 736
See application file for complete search history.

(56) References Cited

U.S. PATENT DOCUMENTS

| | | | | |
|---|---|---|---|---|
| 5,548,488 A | * | 8/1996 | Hansen ................. | H05K 3/326 361/796 |
| 7,466,562 B2 | * | 12/2008 | Gilliland ............ | G01R 31/2808 361/803 |
| 8,259,460 B2 | * | 9/2012 | Bhattacharya ......... | H05K 3/301 174/260 |
| 8,435,078 B2 | * | 5/2013 | Hsueh .................... | H01R 24/86 439/660 |
| 2001/0000768 A1 | * | 5/2001 | Robinson ............... | G01R 11/04 439/517 |
| 2014/0043732 A1 | * | 2/2014 | McKay .................... | H02B 1/04 361/622 |

* cited by examiner

*Primary Examiner* — Hung S Bui
(74) *Attorney, Agent, or Firm* — Rabin & Berdo, P.C.

(57) ABSTRACT

An electrical module and a device using the same are provided. The electrical module comprises a base, a composite component and a pressing sheet. The composite component is disposed on the base and comprises a pad and a conductive sheet. The conductive sheet is embedded in the pad, and the pressing sheet presses on the pad. The pad comprises a main body and a protrusion. The main body has a surface. The protrusion is disposed on the surface of the main body and is compressed between the surface of the main body and the base.

20 Claims, 6 Drawing Sheets

ELECTRICAL MODULE AND DEVICE USING THE SAME

This application claims the benefit of People's Republic of China application Serial No. 201320304878.5, filed May 30, 2013, the subject matter of which is incorporated herein by reference.

BACKGROUND OF THE INVENTION

1. Field of the Invention

The invention relates in general to an electrical module and a device using the same, and more particularly to an electrical module capable of transmitting an electric signal and a device using the same.

2. Description of the Related Art

A sealing of an electrical module disposed on an electronic device is usually poor, and there is a risk that an external fluid is easy to flow into an interior of the electronic device. In case of the sealing between two components of the electronic device being poor, the external fluid may flow into the interior of the electronic device through a gap between two components of the electronic device, causing a shorting of or damage to an electronic component disposed within the interior of the electronic device.

SUMMARY OF THE INVENTION

So, the invention is directed to an electrical module and a device using the same having excellent sealing. Accordingly, the problem of a shorting or damage to an electronic component disposed within the interior of the device, caused by a fluid flowing into the interior of the device, may be resolved.

According to one embodiment of the present invention, an electrical module is provided. The electrical module comprises a base, a composite component and a pressing sheet. The composite component is disposed on the base and comprises a pad and a conductive sheet. The conductive sheet is embedded in the pad, and the pressing sheet is disposed on the composite component.

According to another embodiment of the present invention, an electrical module is provided. The electrical module comprises a base, a circuit board and a plurality of conductive sheets. The conductive sheets are disposed on the base and are electrically connected to the circuit board respectively.

According to another embodiment of the present invention, an electrical module is provided. The electrical module comprises a base, a circuit board, a conductive sheet and an electrical connecter. The base is disposed on between the conductive sheet and the circuit board. The electrical connecter is disposed on the base and the circuit board. The conductive sheet is electrically connected to the circuit board through the electrical connecter.

According to another embodiment of the present invention, an electronic device is provided. The electronic device comprises an electrical module as disclosed above.

The sealing of the electrical module of the invention is excellent, so that the problem of a shorting or damage to an electronic component disposed within the interior of the device, caused by an exterior fluid flowing into the interior of the device, may be resolved or reduced.

The above and other aspects of the invention will become better understood with regard to the following detailed description of the preferred but non-limiting embodiment(s). The following description is made with reference to the accompanying drawings.

DETAILED DESCRIPTION OF THE INVENTION

Figure 1A:
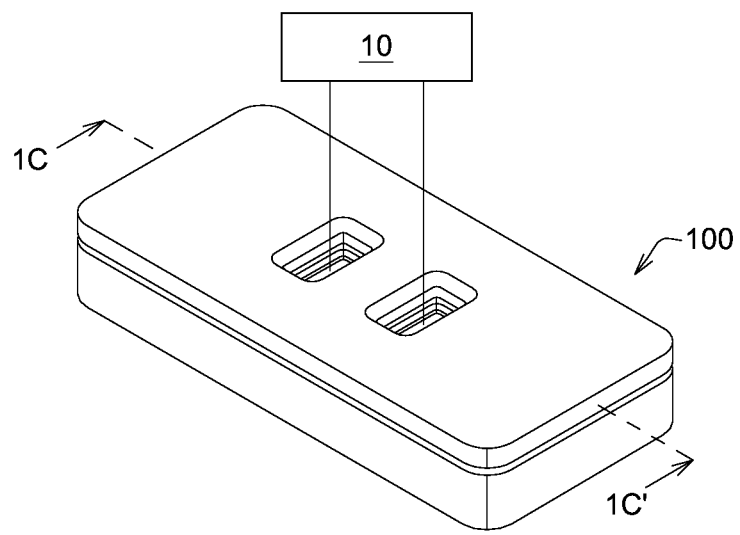
FIG. 1A illustrates an electrical module according to an embodiment of the invention.

Referring to FIG. 1A, an electrical module according to an embodiment of the invention is illustrated. The electrical module 100, which can be a communication between a device and an exterior for electric signal or electric energy, may be built within a device (not shown). The electrical module 100 may be a charging/discharging module or a transmitting port of electric signal. In detail, for example, the device is a portable electronic device or a hand-held electronic device.

For example, as illustrated in FIG. 1A, an external electronic port 10 may electrically connect to the electrical module 100 for transmitting the electric signal or the electric energy to a battery (not shown) within the device. The device comprises, but not limited thereto, a mobile communication device (such as a cell phone), an image catching device, a camera, a tablet PC, a notebook or other device required for communicating with the exterior. In addition, the battery as described above may be a port of the device or a port of the charging/discharging module.

Figure 1B:
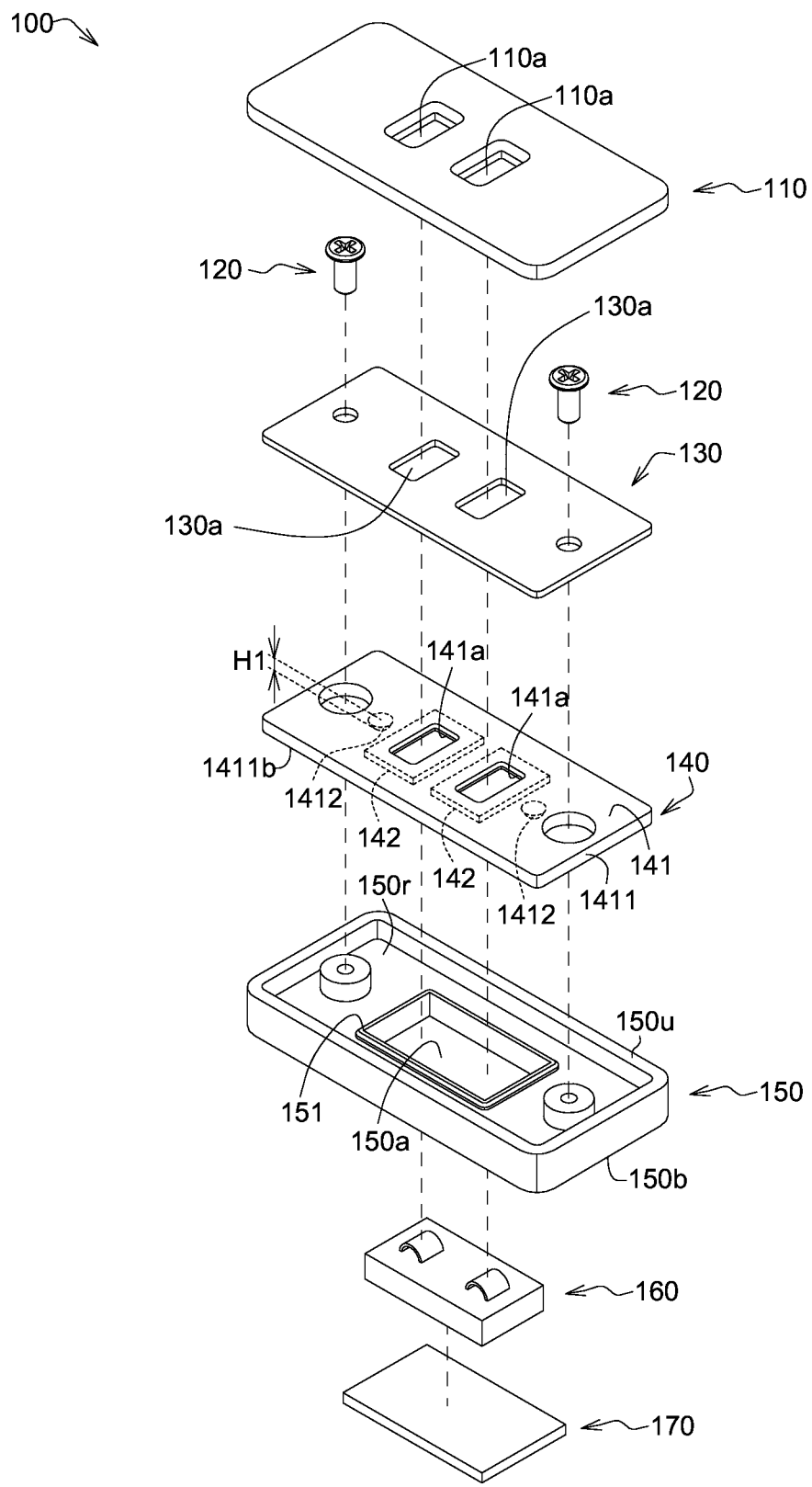
FIG. 1B illustrates an explosion view of the electrical module of FIG. 1A.
Figure 1C:
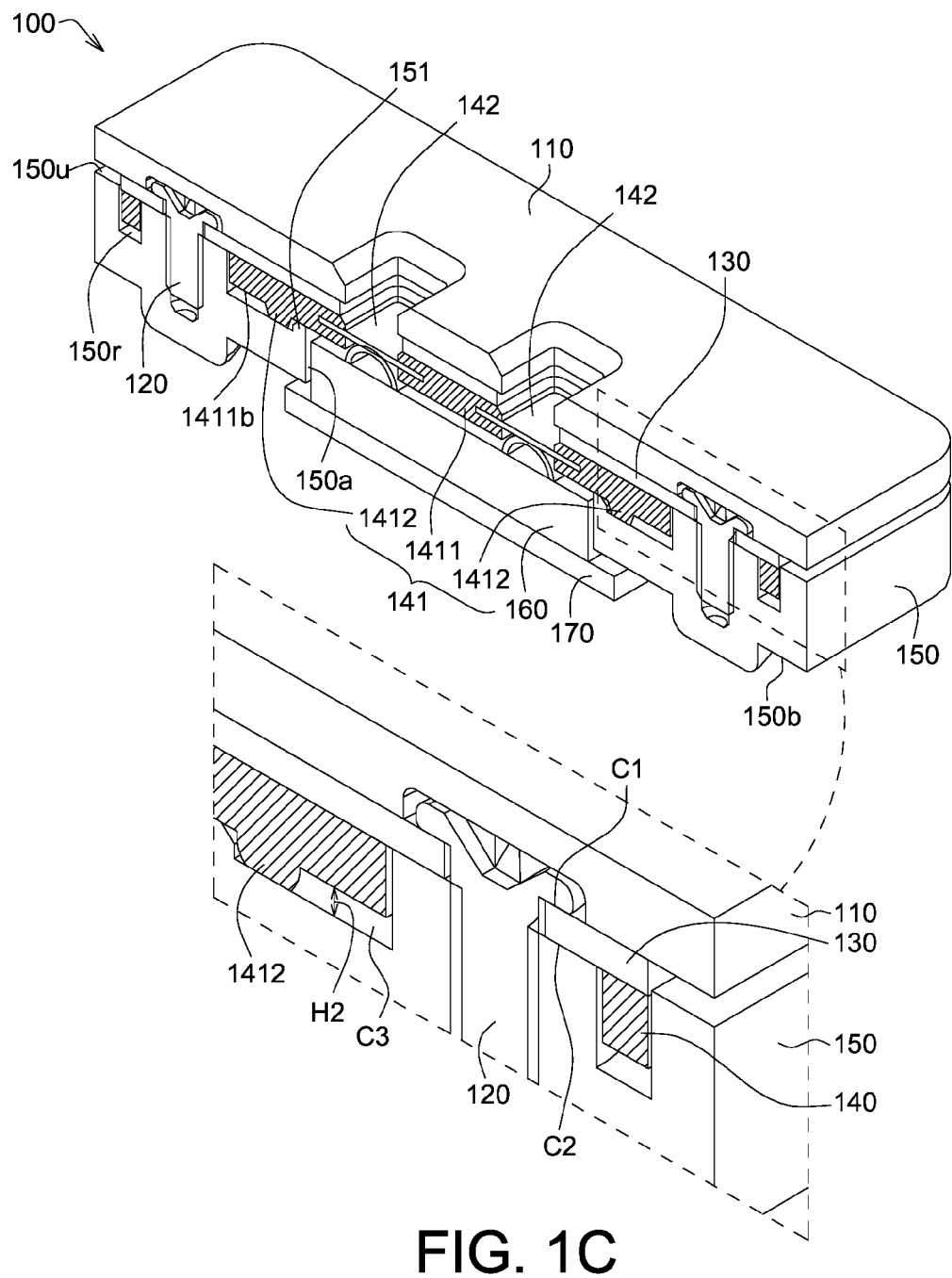
FIG. 1C illustrates a cross-sectional view of the electrical module of FIG. 1A along a direction 1C-1C'.

Referring to FIGS. 1B and 1C, FIG. 1B illustrates an explosion view of the electrical module of FIG. 1A, and FIG. 1C illustrates a cross-sectional view of the electrical module of FIG. 1A along a direction 1C-1C'.

As illustrated in FIG. 1B, the electrical module 100 comprises a covering 110, a locking component 120, a pressing sheet 130, a composite component 140, a base 150, a electrical connecter 160 and a circuit board 170. In an embodiment, the covering 110, the locking component 120, the pressing sheet 130, the composite component 140, the base 150, the electrical connecter 160 and the circuit board 170 may be pre-assembled as the electrical module 100, and then configuring the assembly thereof to the device. In another embodiment, the locking component 120, the pressing sheet 130 and the composite component 140 may be pre-assembled as the electrical module 100, and then configuring the assembly thereof to the device. Under such design, the covering 110, the base 150, the electrical connecter 160 and/or the circuit board 170 may not belong to the electrical module 100, and the covering 110, the base 150, the electrical connecter 160 and/or the circuit board 170 may be sub-components of the device. Specifically, the electrical connecter 160 may be an electric connecting port or an adapter for electrical signal.

The covering 110, such as a shell, may be pivoted to the device for selectively covering the composite component 140 or exposing the composite component 140. However, the covering 110 also may be fixed to the device. In an embodiment, the covering 110 may be a port of the housing of the device. In another embodiment, the covering 110 may be separately produced and pre-assembled as the electrical module 100 with other components, and then configuring the assembly thereof to the device. In addition, at least one first through hole 110a is formed on the covering 110.

In detail, the locking component 120 may pass through the pressing sheet 130 and the composite component 140 and screw to the base 150 for fixing a relative position between the pressing sheet 130, the composite component 140 and base 150.

As illustrated in FIG. 1B, the pressing sheet 130 has at least one third through hole 130a corresponding to the first through hole 110a of the covering 110, such that at least one external terminal may be electrically connected to the conductive portion 160 through the first through hole 110a and the third through hole 130a.

As illustrated in FIGS. 1B and 1C, the pressing sheet 130 is a metal sheet, such as an iron sheet, a copper sheet, an aluminum sheet, and etc., but the pressing sheet 130 also may be another sheet made of non-metallic material(s). The pressing sheet 130 is disposed between the covering 110 and the composite component 140. The pressing sheet 130 presses on the composite component 140 through a pressure applied from the locking component 120 to the pressing sheet 130. Thus, it can prevent from the external fluid flowing into the electrical module 100 via a connection C1 between the locking component 120 and the pressing sheet 130 and a connection C2 between the pressing sheet 130 and the composite component 140 and damaging electric functions of the electrical connecter 160 and/or the circuit board 170. In addition, when the pressing sheet 130 adopts a metal sheet, a sealing between the locking component 120 and the pressing sheet 130 and a sealing between the pressing sheet 130 and the composite component 140 may be increased, because of the pressing sheet 130 can bear a larger pressure.

The composite component 140 disposes on the base 150 and comprises a pad 141 and at least one conductive sheet 142. The pad 141 and the conductive sheet 142 may be integrated into a single piece using injection molding technology, such as double injection molding, and the pad 141 may be made of rubber or plastic. In the present embodiment, two conductive sheets 142 are defined as two electrical contacts of the electrical module 100 respectively. The two conductive sheets 142 are respectively exposed from two second through holes 141a for contacting a positive electrode and a negative electrode of the external electronic port 10. In another embodiment, the electrical module 100 may have single or more than one the conductive sheets 142 that depend on a function and or a structure of the electrical module 100 or the device.

The pad 141 has two second through holes 141a. Each the second through hole 141a exposes a portion of the corresponding conductive sheet 142, so that the external electronic port 10 may electrically connect to the exposed conductive sheet 142 through the second through holes 141a. In another embodiment, the pad 141 may has single or more than one second through hole 141a that depend on the number of the conductive sheets 142.

As illustrated in FIG. 1C, the conductive sheet 142 is embedded in the pad 141, and the pad 141 clamps two sides of the conductive sheet 142. The pad 141 comprises a main body 1411 and a protrusion 1412. The protrusion 1412 is formed on a first surface 1411b of the main body 1411 and located between the first surface 1411b and the base 150, wherein the first surface 1411b contacts the base 150. In detail, when the locking component 120 fixing the pressing sheet 130 and the composite component 140 to the base 150, the locking component 120 also applies a force to the protrusion 1412, so that the protrusion 1412 is expanded outward where perpendicular to a direction of the force (as illustrated in an enlargement view of FIG. 1C). Because of the protrusion 1412 being set between the electrical connecter 160 and the locking component 120, the sealing between the pressing sheet 130 and the composite component 140 and the sealing of a region C3 between the composite component 140 and the base 150 may be improving.

As illustrated in FIGS. 1B and 1C, in the present embodiment, the protrusion 1412 is a protruded block. In another embodiment, the protrusion 1412 may be a closed ring-shaped protrusion for increasing the sealing of the region C3 between the composite component 140 and the base 150. In another embodiment, the protrusion 1412 also may be an open ring-shaped protrusion.

As illustrated in FIGS. 1B and 1C, in another embodiment, a free height of the protrusion 1412, before the protrusion 1412 is compressed, is larger than a distance H2 between the first surface 1411b of the main body 1411 and a bottom of a receiving recess 150r (as illustrated in an enlargement view of FIG. 1C). While the locking component 120 fixes the pressing sheet 130 and the composite component 140 to the base 150, the protrusion 1412 is compressed and accordingly the sealing is improving. When the larger ratio of the height H1 and the distance H2 is, the larger compression rate of the protrusion 1412 is. Although the greater sealing is, the shorter lifetime of the pad 141 is. Otherwise, the less ratio of the height H1 and the distance H2 is, the less compression rate is. The less compression rate of the protrusion 1412 is, the poorer sealing is but the longer lifetime of the pad 141 is. In an embodiment, the range of the ratio of the height H1 and the distance H2 may be between 1.2 and 1.4, so that the great sealing and lifetime may be obtained simultaneously, this is not meant to be for limiting.

The conductive sheet 142 may be a conductive flat plate. In the present embodiment, the conductive sheet 142 is exposed from the pad 141. In another embodiment, the conductive sheet 142 is exposed from the pad 141 but is not projected beyond an outer border of the pad 141, wherein the outer border means the outermost side of the main body 1411, such as the first surface 1411b of the main body 1411. In another embodiment, the conductive sheet 142 may extend toward the circuit board 170.

The base 150 has an opening 150a corresponding to the conductive sheet 142 for exposing the conductive sheet 142, so that the electrical connecter 160 may electrically connect to two conductive sheets 142 through the opening 150a. In addition, the base 150 has a first surface 150b and a second surface 150u opposite to the first surface 150b, wherein the first surface 150b faces to the electrical connecter 160 and the second surface 150u faces to the composite component 140. The receiving recess 150r of the base 150 is extended toward the first surface 150b from the second surface 150u, and the receiving recess 150r can receive the composite component 140. The base 150 further comprises a ring rib 151 formed on a bottom surface of the receiving recess 150r and surrounds the opening 150a. While the locking component 120 fixes the pressing sheet 130 and the composite component 140 to the base 150, the ring rib 151 surrounds the conductive sheet 142 and tightly presses the pad 141. In the present embodiment, the ring rib 151 is a closed ring-shaped rib, but the ring rib 151 also may be an open ring-shaped rib.

Figure 2:
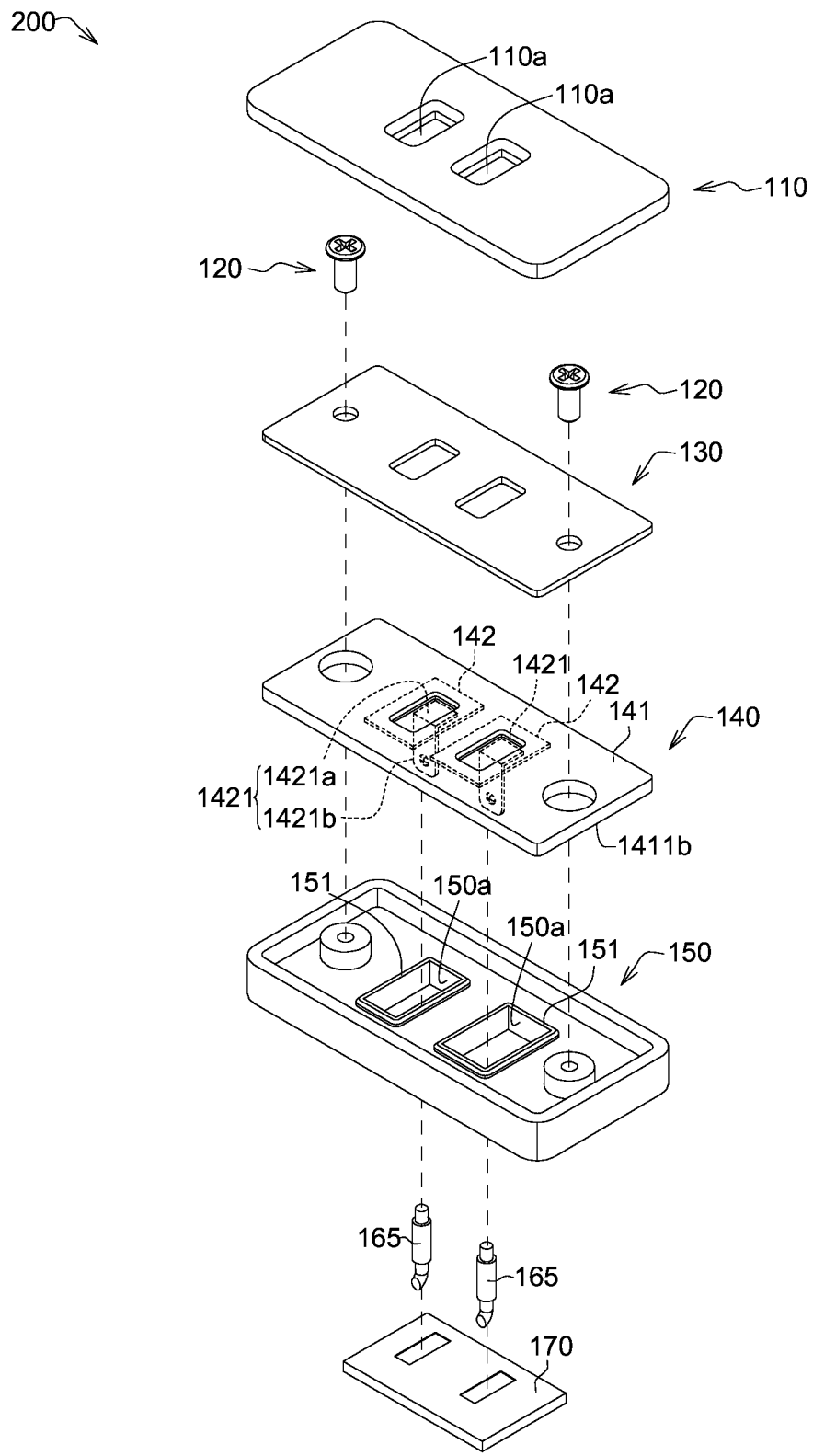
FIG. 2 illustrates an explosion view of the electrical module according to another embodiment of the invention.

Referring to FIG. 2, an explosion view of an electrical module 200 according to another embodiment of the invention is illustrated. The electrical module 200 comprises the covering 110, the locking component 120, the pressing sheet 130, the composite component 140, the base 150, a conductive wire 165 and the circuit board 170.

The composite component 140 comprises the pad 141 and at least one conductive sheet 142, wherein a port of the conductive sheet 142 is embedded in the pad 141, and another port of the conductive sheet 142 is extended beyond an outer border of the pad 141. For example, each conductive sheet 142 further comprises a pin 1421, wherein the pin 1421 extends toward the circuit board 170 and projects beyond the outer border of the pad 141. For example, the outer border of the pad 141 is to the first surface 1411b of the main body 141 or other outer surface. In other words, the conductive sheet 142 is not entirely embedded in the pad 141, and the pin 1421 projects beyond the first surface 1411b of the pad 141. After the electrical module 200 is assembled, the pin 1421 passes through the opening 150a of the base 150 and extends toward the circuit board 170.

The pin 1421 may be electrically connected to the conductive sheet 142. For example, the pin 1421 may be fixed to a surface of the conductive sheet 142 by adhesive, welding, engagement, other temporary bonding technology or permanent bonding technology. In detail, the pin 1421 comprises a connecting portion 1421a and an extending portion 1421b. Wherein, the connecting portion 1421a may be welded on the conductive sheet 142 by laser welding, and the extending portion 1421b may be connected to the connecting portion 1421a with an angle between the connecting portion 1421a and the extending portion 1421b. The angle may be 90 degree or different from 90 degree. In terms of manufacturing method, the pin 1421 may form the connecting portion 1421a and the extending portion 1421b in the same bending process or pressing process. In another embodiment, the connecting portion 1421a and the extending portion 1421b may be separately formed, and then the connecting portion 1421a and the extending portion 1421b are connected together by adhesive, welding, engagement, other temporary bonding technology or permanent bonding technology.

The base 150 has two opening 150a. After the electrical module 200 is assembled, two pins 1421 may pass through two openings 150a and electrically connected to the conductive wires 165, respectively. Moreover, the two pins 1421 may connect to two conductive wires 165 respectively for electrically connecting the circuit board 170.

Figure 3A:
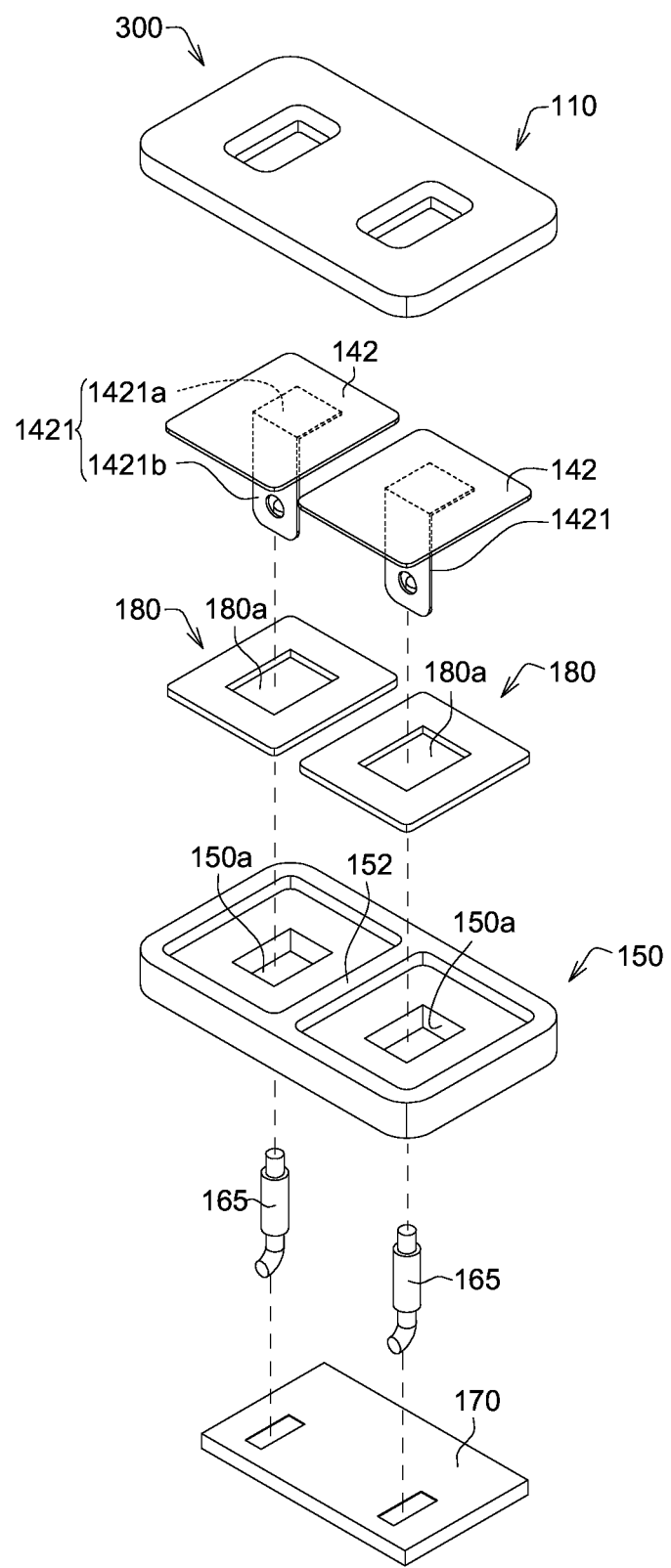
FIG. 3A illustrates an explosion view of the electrical module according to another embodiment of the invention.
Figure 3B:
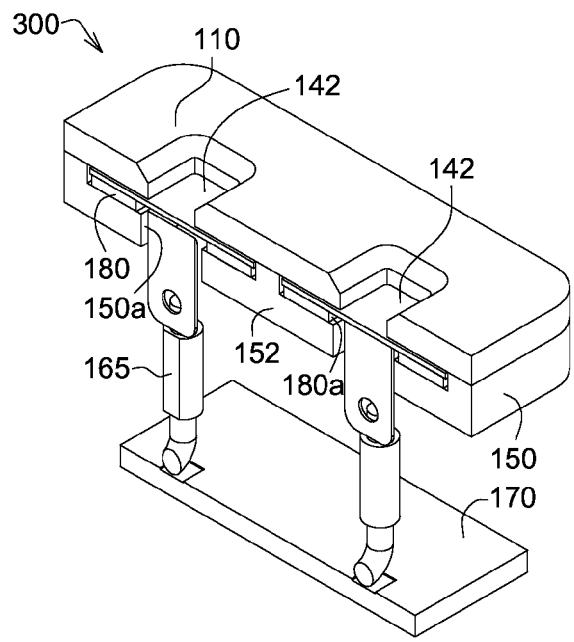
FIG. 3B illustrates a cross-sectional view of the assembled electrical module of FIG. 3A.

Referring to FIGS. 3A and 3B, FIG. 3A illustrates an explosion view of an electrical module 300 according to another embodiment of the invention, and FIG. 3B illustrates a cross-sectional view of the assembled electrical module 300 of FIG. 3A.

As illustrated in FIG. 3A, the electrical module 300 comprises the covering 110, at least one conductive sheet 142, at least one spacer 180, the base 150, at least one conductive wire 165 and the circuit board 170.

In the present embodiment, each conductive sheet 142 is disposed between the covering 110 and the spacer 180. Each conductive sheet 142 further comprises a pin 1421, wherein the pins 1421 electrically connect to a surface of the conductive sheet 142 and extend toward the conductive wires 165. After the electrical module 300 is assembled, each conductive sheet 142 passes through the corresponding opening 150a of the base 150 and extends to connect the corresponding conductive wire 165 for electrically connecting to the circuit board 170 through the corresponding conductive wires 165. The number of the conductive sheets 142 is equal to the number of electrical contacts of the electrical module 300. In the present embodiment, the number of the conductive sheets 142 is two, but the number of the conductive sheets 142 may be single or more than two.

As illustrated in FIG. 3B, for example, the spacer 180 is made of rubber or plastic, and each spacer 180 is disposed between the base 150 and the corresponding conductive sheet 142. While the covering 110 presses the conductive sheets 142, an accompanying pressure apply to the spacer 180 and the whole sealing of the electrical module 300 may be improving. In the present embodiment, the base 150 comprises a supporter 152 disposed between the two opening 150a. Wherein, the supporter 152 may help the structure strength of the base 150 stronger. Each spacer 180 may be formed a ring-shape, so that the corresponding conductive sheet 142 may pass through a central through hole 180a of the corresponding spacer 180 for electrically connecting to the corresponding conductive wire 165. In another embodiment, several spacers 180 may be formed as an integrated structure.

The number of the spacer 180 may be equal to that of electrical contacts of the electrical module 300. In the present embodiment, the number of the spacers 180 is two, but the number of the spacers 180 may be single or more than two.

Figure 4:
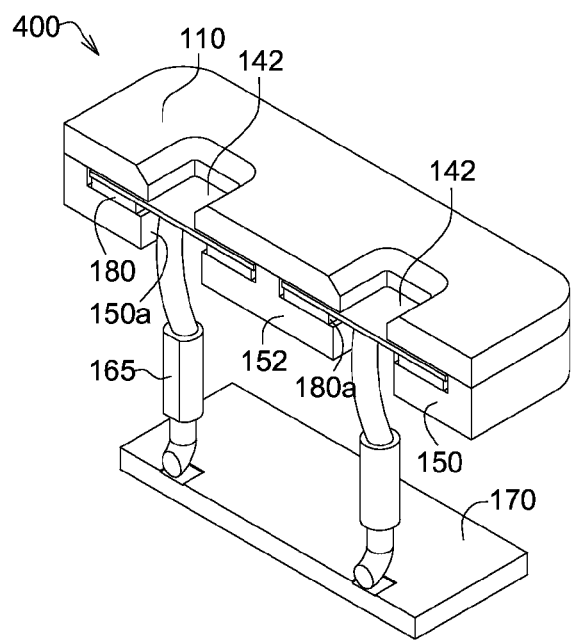
FIG. 4 illustrates a partial cross-sectional view of the assembled electrical module according to another embodiment of the invention.

Referring to FIG. 4, a partial cross-sectional view of an assembled electrical module 400 according to another embodiment of the invention is illustrated. The electrical module 400 comprises the covering 110, at least one conductive sheet 142, at least one spacer 180, the base 150, at least one conductive wire 165 and the circuit board 170. The conductive sheet 142 of the present embodiment is different from the conductive sheet 142 of FIG. 3. The conductive sheet 142 of the present embodiment is a flat plate. Under such design, each conductive wire 165 may pass through the corresponding opening 150a of the base 150 and the corresponding central through hole 180a of the spacer 180 to be electrically connected to the corresponding conductive sheet 142.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An electrical module for a device, which electrically connects to an external component, comprising:
   a base comprising an opening;
   a covering having at least one through hole;
   a conductive sheet being between the base and the covering and disposed correspondingly to the through hole for exposing an upper surface of the conductive sheet; and
   a circuit board electrically connecting to the conductive sheet via the opening of the base;
   wherein the opening exposes a lower surface of the conductive sheet for the electrically connecting of the conductive sheet to the circuit board.

2. The electrical module according to claim 1, wherein the conductive sheet comprises a pin, and the conductive sheet electrically connects to the circuit board through the pin.

3. The electrical module according to claim 1, further comprising an electrical connecter and/or a conductive wire, and the electrical connecter and/or the conductive wire electrically connects the conductive sheet and the circuit board.

4. The electrical module according to claim 1, further comprising a composite component, the composite component has a pad and the conductive sheet, and the conductive sheet is embedded in the pad.

5. The electrical module according to claim 4, wherein the pad comprises a main body with a first surface and a protrusion on the first surface, and the first surface touches the base through the protrusion.

6. The electrical module according to claim 1, further comprising a pressing sheet between the conductive sheet and the covering.

7. The electrical module according to claim 6, further comprising a locking component, wherein the locking component passes through the pressing sheet and the conductive sheet and screws to the base.

8. The electrical module according to claim 1, further comprising a spacer between the conductive sheet and the base.

9. The electrical module according to claim 1, wherein the external component electrically connects to the conductive sheet through the through hole of the covering.

10. An electrical module having a covering with a plurality of through holes, comprising:
 a base comprising an opening;
 a circuit board; and
 a plurality of conductive sheets being on the base and respectively disposed correspondingly to the through holes for exposing an upper surface of each the conductive sheets, each conductive sheet comprising a pin on a lower surface thereof opposite to the upper surface, and the pins passing through the opening of the base and electrically connecting to the circuit board.

11. The electrical module according to claim 10, further comprising an electrical connecter and/or a plurality of conductive wires, and the electrical connecter and/or the conductive wires electrically connect(s) to the circuit board and the pins of the conductive sheets.

12. The electrical module according to claim 10, further comprising a composite component, wherein the composite component comprises a pad, and the conductive sheet is embedded in the pad.

13. The electrical module according to claim 12, further comprising a pressing sheet on the composite component.

14. The electrical module according to claim 13, further comprising a locking component, wherein the locking component passes through the pressing sheet and the composite component and screws to the base.

15. The electrical module according to claim 10, further comprising a plurality of spacers, wherein the spacers are between the base and the conductive sheets respectively.

16. A device having an electrical module that connects to an external component, and a covering with a through hole, the electrical module comprising:
 a base comprising an opening;
 a plurality of conductive sheets being between the base and the covering and disposed correspondingly to the through hole for exposing an upper surface of each conductive sheet, each conductive sheet comprising a in on a lower surface thereof opposite to the upper surface and passing through the opening; and
 a circuit board electrically connected to the conductive sheets through the opening of the base;
 wherein each conductive sheet electrically connects to the circuit board through the pin, an electrical connecter and/or a plurality of conductive wires.

17. The device according to claim 16, wherein the through hole of the covering is a first through hole, the electrical module further comprises a composite component having a pad, each conductive sheet is embedded in the pad, and the pad has a second through hole corresponding to the first through hole.

18. The device according to claim 17, wherein the electrical module further comprises a pressing sheet on the composite component, and the pressing sheet has a third through hole corresponding to the first through hole.

19. The device according to claim 18, wherein the external component electrically connects to the conductive sheets via the first through hole.

20. The device according to claim 16, wherein the electrical module further comprises a plurality of spacers, and each of the conductive sheets is between the covering and the spacers respectively.

* * * * *